United States Patent [19]

Sano

[11] Patent Number: 4,490,685
[45] Date of Patent: Dec. 25, 1984

[54] DIFFERENTIAL AMPLIFIER
[75] Inventor: Yoshiaki Sano, Yokohama, Japan
[73] Assignee: Fujitsu Limited, Kawasaki, Japan
[21] Appl. No.: 478,720
[22] Filed: Mar. 25, 1983
[30] Foreign Application Priority Data Mar. 30, 1982 [JP] Japan ................................. 57-50094

[51] Int. Cl.$^3$ .............................................. H03F 3/45
[52] U.S. Cl. .................................... 330/252; 330/261
[58] Field of Search ................. 330/252, 259, 261, 260

[56] References Cited
U.S. PATENT DOCUMENTS 4,296,383 10/1981 Jeandot et al. ....................... 330/259

FOREIGN PATENT DOCUMENTS

2204419 10/1974 Fed. Rep. of Germany .
2846940  5/1979 Fed. Rep. of Germany .
3035471  4/1981 Fed. Rep. of Germany .
3138078  5/1982 Fed. Rep. of Germany .

Primary Examiner—James B. Mullins
Assistant Examiner—G. Wan
Attorney, Agent, or Firm—Staas & Halsey

[57] ABSTRACT

A differential amplifier is basically comprised of first and second transistors ($Q_1$, $Q_2$) each having a negative resistance feedback. A current source ($IP_2$) and a third transistor ($Q_3$) connected in series are provided on the side of the first transistor, and a current source ($IP_3$) and a fourth transistor ($Q_4$) connected in series are provided on the side of the second transistor. The base and emitter of the first transistor are connected to the respective collector and base of the third transistor so that the potential at the base of the first transistor is negatively fed back to the emitter thereof. Similarly, the base and emitter of the second transistor are connected to the respective collector and base of the fourth transistor so that the potential at the base of the second transistor is negatively fed back to the emitter thereof.

3 Claims, 8 Drawing Figures

DIFFERENTIAL AMPLIFIER

BACKGROUND OF THE INVENTION (1) Field of the Invention

The present invention relates to a differential amplifier for audio-frequency linear amplification.

(2) Description of the Prior Art

A differential amplifier is used for amplifying an alternating current or voltage having an audio frequency. Therefore, the linear amplification characteristics are important.

A prior art differential amplifier comprises first and second transistors connected, via negative feedback resistors, to a common current source. In the prior art, since the emitter-base diodes of the transistors have logarithmic characteristics, the amplification characteristics are nonlinear, which is a disadvantage.

SUMMARY OF THE INVENTION

It is an object of the present invention to provide a differential amplifier in which the linear amplification characteristics are improved.

According to the present invention, a current source and a transistor connected in series, are provided on each side of the first and second transistors, and, accordingly, the potential at the base of the first and second transistors is negatively fed back to the emitter thereof. As a result, the base-emitter voltage of the first and second transistors is almost constant, with the result that the linear amplification characteristics are improved.

The present invention will be more clearly understood from the description as set forth below, in which the present invention is contrasted with the prior art and reference is made to the accompanying drawings.

DESCRIPTION OF THE PREFERRED EMBODIMENTS

Figure 1:
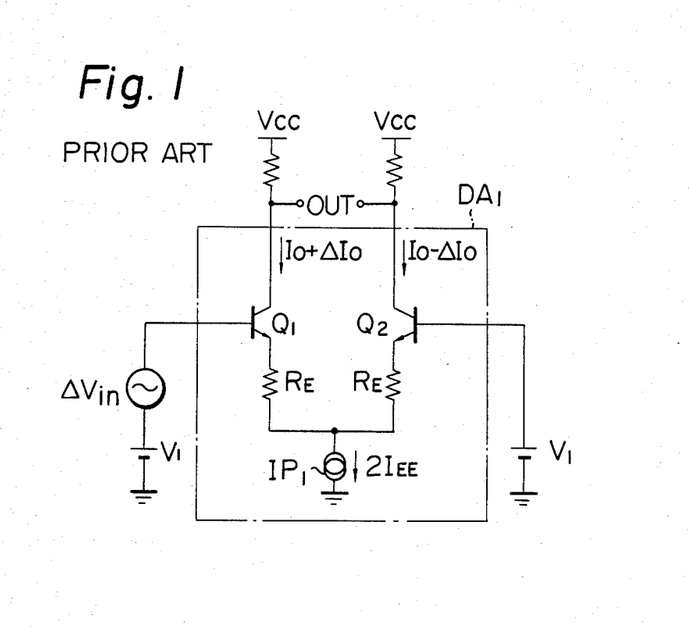
FIG. 1 is a circuit diagram of a prior art differential amplifier.

In FIG. 1, which is a prior art differential amplifier, a pair of transistors $Q_1$ and $Q_2$ are connected via negative feedback resistors $R_E$ to a common current source $IP_1$. A differential input voltage $\Delta V_{in}$ is applied to the base of the transistor $Q_1$, and an output $\Delta I_0$ is obtained by a voltage/current conversion gain based on a bias condition ($2I_{EE}$). Note that, in this case, the offset voltage between the transistors $Q_1$ and $Q_2$ becomes zero when $\Delta V_{in}$ equals zero.

The potential $V_1 + \Delta V_{in}$ is represented by:

$$V_1 + \Delta V_{in} = V_{BE1} + \frac{1 + h_{FE}}{h_{FE}}(I_0 + \Delta I_0) \cdot R_E + V_{IP1} \quad (1)$$

where $V_{BE1}$ is the base-emitter voltage of the transistor $Q_1$, $h_{FE}$ is the current amplification factor, and $V_{IP1}$ is the voltage drop of the current source $IP_1$.

The potential $V_1$ is represented by:

$$V_1 = B_{BE2} + \frac{1 + h_{FE}}{h_{FE}}(I_0 - \Delta I_0) \cdot R_E + V_{IP1} \quad (2)$$

where $V_{BE2}$ is the base-emitter voltage of the transistor $Q_2$. Therefore, from the equations (1) and (2), $$\Delta V_{in} = V_{BE1} - V_{BE2} + 2 \cdot \frac{1 + h_{FE}}{h_{FE}} \Delta I_0 \cdot R_E \quad (3)$$

The transistors $Q_1$ and $Q_2$ have the following logarithmic voltage/current characteristics:

$$V_{BE} = \frac{kT}{q} \ln \frac{I_c}{I_s}$$

where $V_{BE}$ is the transistor's emitter-base voltage, $I_c$ is the transistor's collector current, $I_s$ is the collector saturation current, k is Boltzmann's constant, q is the charge of one electron, and T is the absolute temperature in degrees kelvin. Therefore, the equation (3) is replaced by:

$$\Delta V_{in} = \frac{kT}{q} \ln \frac{I_0 + \Delta I_0}{I_s} - \frac{kT}{q} \ln \frac{I_0 - \Delta I_0}{I_s} + \quad (4)$$

$$2 \cdot \frac{1 + h_{FE}}{h_{FE}} \Delta I_0 \cdot R_E$$

$$= \frac{kT}{q} \ln \frac{I_0 + \Delta I_0}{I_0 - \Delta I_0} + 2 \cdot \frac{1 + h_{FE}}{h_{FE}} \Delta I_0 \cdot R_E$$

Thus, if $\Delta I_0 / I_0 < 1$ (in the case of a signal having a small amplitude), $$\Delta V_{in} \simeq 2 \cdot \frac{1 + h_{FE}}{h_{FE}} \Delta I_0 \cdot R_E \quad (5)$$

Figure 2:
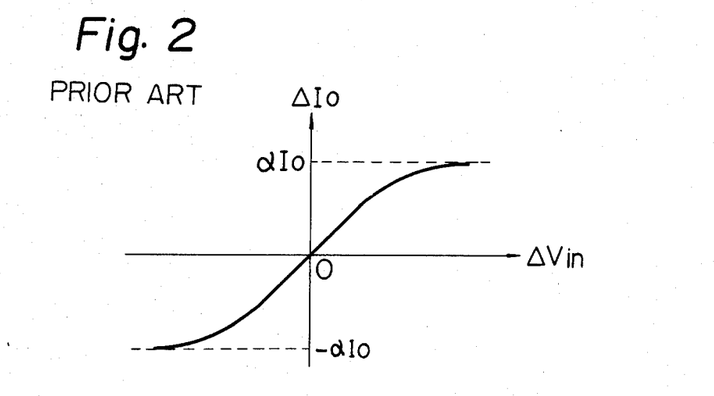
FIG. 2 is a graph showing the amplification characteristics of the differential amplifier of FIG. 1.

Therefore, the linear amplification charcteristics are obtained. However, as $\Delta I_0$ increases, the first expression of the equation (5) causes a large error, thereby deteriorating the linear amplification characteristics, as is shown in FIG. 2. In FIG. 2, note that $\alpha$ equals $h_{FE}/(1+h_{FE})$ and is approximately 1.

In the equation (5), in order to improve the linear amplification characteristics, one approach is to increase $I_0$ ($=\alpha I_{EE}$) in the first expression. In this approach, however, $I_{EE}R_E$ is increased, with the result that the efficiency of the power supply is reduced. Another approach is to increase $R_E$ in the second expression of the equivalent. In this approach, however, the efficiency of the power supply is also reduced, and, in addition, the gain $\Delta I_0/\Delta V_{in}$ is reduced.

Figure 3:
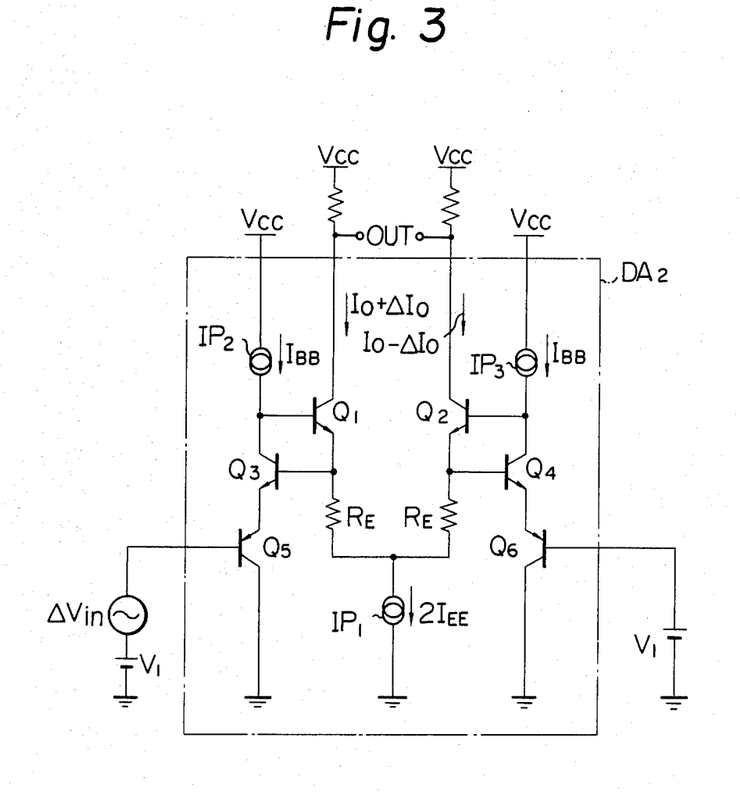
FIG. 3 is a circuit diagram of a first embodiment of the differential amplifier according to the present invention.

In FIG. 3, which is a circuit diagram of first embodiment according to the present invention, transistors $Q_3$ and $Q_4$ having the same polarity as the transistors $Q_1$ and $Q_2$, transistors $Q_5$ and $Q_6$ having a polarity opposite to that of the transistors $Q_1$ and $Q_2$, and two current sources $IP_2$ and $IP_3$ are added to the differential amplifier $DA_1$ of FIG. 1.

The base current and emitter current of the transistor $Q_1$ are $$\frac{1}{h_{FE}}(I_0 + \Delta I_0) \text{ and } \frac{1 + h_{FE}}{h_{FE}}(I_0 + \Delta I_0),$$

respectively, and, accordingly, the collector current of the transistor $Q_3$ is $$I_{BB} - \frac{1}{h_{FE}}(I_0 + \Delta I_0).$$

In addition, the base current and emitter current of the transistor $Q_3$ are $$\frac{1}{h_{FE}}I_{BB} - \frac{1}{h_{FE}^2}(I_0 + \Delta I_0) \text{ and}$$

$$\frac{1 + h_{FE}}{h_{FE}}\left\{I_{BB} - \frac{1}{h_{FE}}(I_0 + \Delta I_0)\right\},$$

respectively, and, accordingly, the current flowing through the resistor $R_E$ one the left side is $$\left(\frac{1 + h_{FE}}{h_{FE}} + \frac{1}{h_{FE}^2}\right)(I_0 + \Delta I_0) - \frac{1}{h_{FE}}I_{BB}.$$

Further, the collector current of the transistor $Q_5$ is the same as that of the transistor $Q_3$.

Similarly, the base current and emitter current of the transistor $Q_2$ are $$\frac{1}{h_{FE}}(I_0 - \Delta I_0) \text{ and } \frac{1 + h_{FE}}{h_{FE}}(I_0 - \Delta I_0),$$

respectively, and, accordingly, the collector current of the transistor $Q_4$ is $$I_{BB} - \frac{1}{h_{FE}}(I_0 - \Delta I_0).$$

In addition, the base current and emitter current of the transistor $Q_4$ are $$\frac{1}{h_{FE}}I_{BB} - \frac{1}{h_{FE}^2}(I_0 - \Delta I_0) \text{ and}$$

$$\frac{1 + h_{FE}}{h_{FE}}\left\{I_{BB} - \frac{1}{h_{FE}}(I_0 - \Delta I_0)\right\},$$

respectively, and, accordingly, the current flowing through the resistor $R_E$ on the right side is $$\left(\frac{1 + h_{FE}}{h_{FE}} + \frac{1}{h_{FE}^2}\right)(I_0 - \Delta I_0) - \frac{1}{h_{FE}}I_{BB}.$$

Further, the collector current of the transistor $Q_6$ is the same as that of the transistor $Q_4$.

Therefore, the potential $V_{1+\Delta Vin}$ is represented by $$V_1 + V_{in} = \left\{\left(\frac{1 + h_{FE}}{h_{FE}} - \frac{1}{h_{FE}}\right)(I_0 + \Delta I_0) - \right. \tag{6}$$

$$\left. \frac{1}{h_{FE}}I_{BB}\right\}R_E + V_{IP1} - V_{BE3} - V_{BE5}$$

where $V_{BE3}$ and $V_{BE5}$ are the base emitter voltages of the transistors $Q_3$ and $Q_5$, respectively. On the other hand, the potential $V_1$ is represented by $$V_1 = \left\{\left(\frac{1 + h_{FE}}{h_{FE}} - \frac{1}{h_{FE}^2}\right)(I_0 - \Delta I_0) - \right. \tag{7}$$

$$\left. \frac{1}{h_{FE}}I_{BB}\right\}R_E + V_{IP1} - V_{BE4} - V_{BE6}$$

where $V_{BE4}$ and $V_{BE6}$ are the base emitter voltages of the transistors $Q_4$ and $Q_6$, respectively. Thus, from the equations (6) and (7), $$\Delta V_{in} = V_{BE4} + V_{BE6} - V_{BE3} - V_{BE5} +$$

$$2\left(\frac{1 + h_{FE}}{h_{FE}} - \frac{1}{h_{FE}^2}\right)\Delta I_0 \cdot R_E$$

$$= \frac{2kT}{q}\ln\frac{I_{BB} - \frac{1}{h_{FE}}(I_0 - \Delta I_0)}{I_{BB} - \frac{1}{h_{FE}}(I_0 + \Delta I_0)} +$$

$$2\left(\frac{1 + h_{FE}}{h_{FE}} - \frac{1}{h_{FE}^2}\right)\Delta I_0 \cdot R_E$$

Generally, since $h_{FE} \gg 1$, $$\Delta V_{in} = \frac{2kT}{q}\ln\frac{(h_{FE}I_{BB} - I_0) + \Delta I_0}{(h_{FE}I_{BB} - I_0) - \Delta I_0} + \tag{8}$$

$$\left(2\frac{1 + h_{FE}}{h_{FE}}\right)\Delta I_0 \cdot R_E$$

Therefore, if $(h_{FE}I_{BB} - I_0) \gg \Delta I_0$, the first expression of the equivalent in the equation (8) is nearly zero, and, accordingly, the first expression hardly affects the second expression of the equivalent at all.

Figure 4:
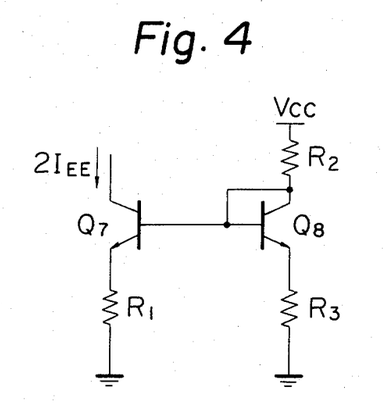
FIG. 4 is a circuit diagram of the current source $IP_1$ of FIG. 3.
Figure 5:
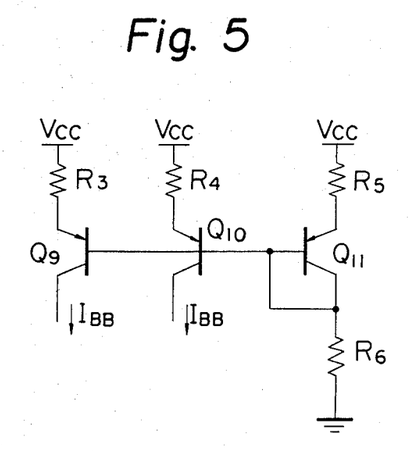
FIG. 5 is a circuit diagram of the current sources $IP_2$ and $IP_3$ of FIG. 3.
Figure 6:
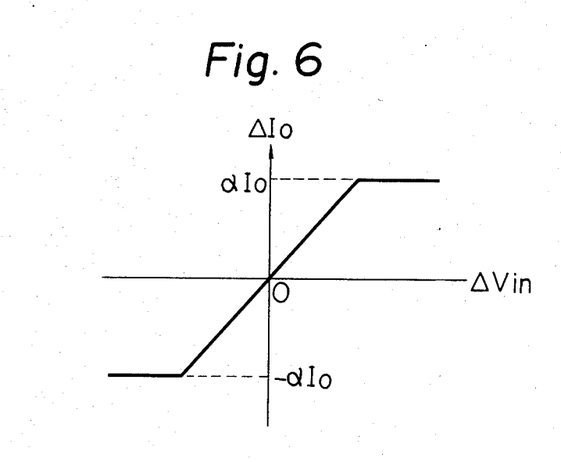
FIG. 6 is a graph of the amplification characteristics of the differential amplifier of FIG. 3.

The current source $IP_1$ is constructed with a current mirror circuit, as is shown in FIG. 4, in which two transistors $Q_7$ and $Q_8$ are provided. The current $2I_{EE}$ is set by resistors $R_1$, $R_2$, and $R_3$. The current sources $IP_2$ and $IP_3$ are also constructed with a current mirror circuit, as is shown in FIG. 5, in which three transistors $Q_9$, $Q_{10}$, and $Q_{11}$ are provided. The current $I_B$ is set by resistors $R_3$, $R_4$, $R_5$, and $R_6$. In this case, $R_3 = R_4$. Therefore, since the currents $I_{BB}$ and $I_{EE}(\approx I_0)$ can be arbitrarily set, the above-mentioned condition $(h_{FE}I_{BB} - I_0) >> \Delta I_0$ is possible. As can be seen from the amplification characteristics, represented by the equation (8), shown in FIG. 6, the linearity of the ratio $\Delta I_0$ to $\Delta V_{in}$ is improved.

That is, in FIG. 3, the current $I_{BB}$ flows mainly through the transistors $Q_3$ and $Q_5$ (or the transistors $Q_4$ and $Q_6$). As a result, the transistors $Q_3$ and $Q_5$ serve only as a battery. Therefore, the emitter voltage of the transistor $Q_1$ changes immediately after $\Delta V_{in}$ changes. In addition, the collector voltage of the transistor $Q_3$ changes immediately after the base voltage thereof changes. In other words, the base voltage of the transistor $Q_1$ is negatively fed back to the emitter voltage thereof.

It should be noted that the transistors $Q_5$ and $Q_6$ are not indispensable. If the circuits for $\Delta V_{in}$ and $V_1$ have a low impedance, they can be omitted.

Figure 7:
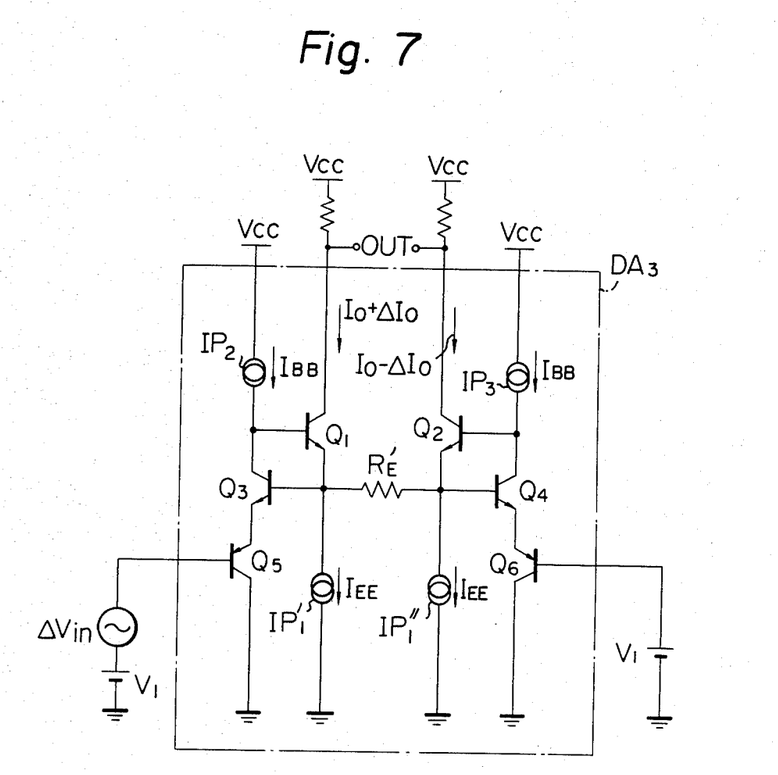
FIG. 7 is a circuit diagram of a second embodiment of the differential amplifier according to the present invention.
Figure 8:
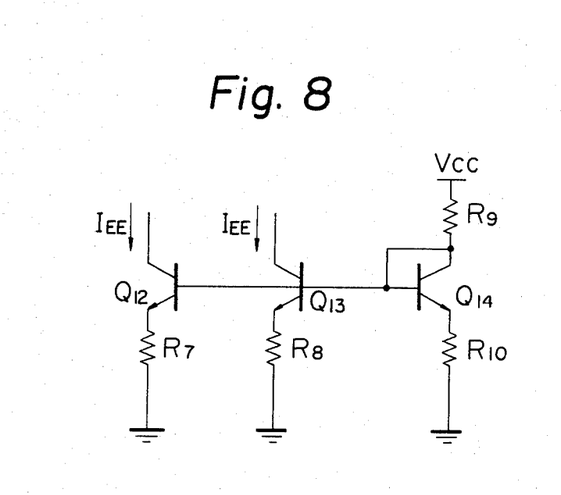
FIG. 8 is a circuit diagram of the current sources $IP_1'$ and $IP_1''$ of FIG. 7.

In FIG. 7, which is a second embodiment of the present invention, two current sources $IP_1'$ and $IP_1''$ and an emitter resistor $R_E'$ are provided instead of the current source $IP_1$ and the emitter resistors $R_E$ of FIG. 3. The current sources $IP_1'$ and $IP_1''$ are also constructed with a current mirror circuit, as is shown in FIG. 8, in which three transistors $Q_{12}$, $Q_{13}$, and $Q_{14}$ are provided. The current $I_{EE}$ is set by resistors $R_7$, $R_8$, and $R_{10}$. In this case, $R_7 = R_8$. The operation of the differential amplifier $DA_3$ of FIG. 7 is exactly the same as that of the differential amplifier $DA_2$ of FIG. 3.

In FIGS. 3 and 7, the transistors $Q_1$ and $Q_2$ can be constructed with a Darlington circuit so as to increase the current gain. In addition, the polarities of all the transistors can be reversed.

In FIG. 3, when $2I_{33} = 0.2$ mA, $I_{BB} = 0.1$ mA, and $R_E = 260\Omega$ and when the amplitude of $\Delta V_{in}$ is only a quarter of the full amplitude, the distortion factor is less than 0.01%. On the other hand, in the prior art differential amplifier $DA_1$, the distortion factor is about 1.1 under the same conditions.

I claim:

1. A differential amplifier operatively connected to receive first and second input signals, comprising:
    a first current source for generating a first current;
    second and third current sources, each of which generates a second current;
    emitter resistors operatively connected to said first current source;
    first and second transistors having a first polarity, operatively connected to said second and third current sources, said first and second transistors having collectors serving as output terminals, having bases operatively connected to said second and third current sources, respectively, and having emitters operatively connected to said emitter resistors;
    a third transistor having the first polarity, having a collector operatively connected to said second current source, having a base operatively connected to said emitter of said first transistor, and having an emitter operatively connected to receive the first input signal; and
    a fourth transistor having the first polarity, having a collector operatively connected to said third current source, having a base operatively connected to said emitter of said second transistor, and having an emitter operatively connected to receive the second input signal.

2. A differential amplifier operatively connected to receive first and second input signals, comprising:
    first and second current sources, each of which generates a first current;
    third and fourth current sources, each of which generates a second current;
    first and second transistors having a first polarity, said first and second transistors having collectors serving as output terminals, having bases, respectively, operatively connected to said third and fourth current sources and having emitters, respectively, operatively connected to said first and second current sources;
    an emitter resistor operatively connected to said emitters of said first and second transistors;
    a third transistor having a first polarity, having a collector operatively connected to said third current source, having a base operatively connected to said emitter of said first transistor, and having an emitter operatively connected to receive the first input signal; and
    a fourth transistor having the first polarity, having a collector operatively connected to said fourth current source, having a base operatively connected to said emitter of said second transistor, and having an emitter operatively connected to receive the second input signal.

3. A differential amplifier as set forth in claim 1 or 2, further comprising:
    a fifth transistor having a second polarity opposite the first polarity, having an emitter operatively connected to said emitter of said third transistor, having a base operatively connected to receive the first input signal, and having a collector; and
    a sixth transistor having the second polarity, having an emitter operatively connected to said emitter of said fourth transistor, having a base operatively connected to receive the second input signal, and having a collector.

* * * * *

UNITED STATES PATENT AND TRADEMARK OFFICE
CERTIFICATE OF CORRECTION

PATENT NO. : 4,490,685

DATED : DECEMBER 25, 1984

INVENTOR(S) : YOSHIAKI SANO

It is certified that error appears in the above-identified patent and that said Letters Patent is hereby corrected as shown below:

```
FRONT PAGE, [57] ABSTRACT
            line 1, "is basically comprised of"
            should be --including--.

Col. 2, line 48, "<" should be --<<--;
        line 54, "charcteristics" should be
            --characteristics--.
```

Col. 4, first equation, "$\dfrac{1}{h_{FE}}$" should be --$\dfrac{1}{h_{FE}^2}$--; and "$\dfrac{1}{h_{FE}^2}$" should be --$\dfrac{1}{h_{FE}}$--;

Equation 6, line 12, "$\dfrac{1}{h_{FE}}$" should be --$\dfrac{1}{h_{FE}^2}$--.

UNITED STATES PATENT AND TRADEMARK OFFICE
CERTIFICATE OF CORRECTION

PATENT NO. : 4,490,685

DATED : DECEMBER 25, 1984

INVENTOR(S) : YOSHIAKI SANO

It is certified that error appears in the above-identified patent and that said Letters Patent is hereby corrected as shown below:

Col. 5, line 29, "$R_8$, and" should be --$R_8$, $R_9$, and--;

line 37, "$2I_{33}$" should be --$2I_{EE}$--.

Signed and Sealed this

Twenty-first Day of May 1985

[SEAL]

Attest:

DONALD J. QUIGG

Attesting Officer

Acting Commissioner of Patents and Trademarks